United States Patent
Kuo

(10) Patent No.: US 9,319,013 B2
(45) Date of Patent: Apr. 19, 2016

(54) OPERATIONAL AMPLIFIER INPUT OFFSET CORRECTION WITH TRANSISTOR THRESHOLD VOLTAGE ADJUSTMENT

(71) Applicant: MIE Fujitsu Semiconductor Limited, Kuwana (JP)

(72) Inventor: Augustine Kuo, Berkeley, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 50 days.

(21) Appl. No.: 14/463,568

(22) Filed: Aug. 19, 2014

(65) Prior Publication Data
US 2016/0056780 A1 Feb. 25, 2016

(51) Int. Cl.
H03F 3/45 (2006.01)

(52) U.S. Cl.
CPC .. *H03F 3/45179* (2013.01); *H03F 2003/45008* (2013.01); *H03F 2203/45112* (2013.01); *H03F 2203/45214* (2013.01)

(58) Field of Classification Search
USPC ...................................... 330/261, 9
IPC ........................................ H03F 3/45
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |

(Continued)

FOREIGN PATENT DOCUMENTS

| | | |
|---|---|---|
| EP | 0274278 A1 | 7/1988 |
| EP | 0312237 A2 | 4/1989 |

(Continued)

OTHER PUBLICATIONS

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.

(Continued)

*Primary Examiner* — Patricia T Nguyen
(74) *Attorney, Agent, or Firm* — Baker Botts L.L.P.

(57) ABSTRACT

A device can include an operational amplifier (op amp) circuit having a differential transistor pair, a first transistor of the differential transistor pair being formed in a first well of a substrate and a second transistor of the differential transistor pair being formed in a second well of the substrate; a body bias generator configured to generate at least a first body bias voltage for the first well, and not the second well, that varies in response to a first body bias control value; and a control circuit configured to selectively generate the first body bias control value in response to an input offset voltage of the op amp.

20 Claims, 8 Drawing Sheets

(56) References Cited

U.S. PATENT DOCUMENTS

| | | | |
|---|---|---|---|
| 4,885,477 A | 12/1989 | Bird et al. | |
| 4,908,681 A | 3/1990 | Nishida et al. | |
| 4,945,254 A | 7/1990 | Robbins | |
| 4,956,311 A | 9/1990 | Liou et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,294,821 A | 3/1994 | Iwamatsu | |
| 5,298,763 A | 3/1994 | Shen et al. | |
| 5,369,288 A | 11/1994 | Usuki | |
| 5,373,186 A | 12/1994 | Schubert et al. | |
| 5,384,476 A | 1/1995 | Nishizawa et al. | |
| 5,426,328 A | 6/1995 | Yilmaz et al. | |
| 5,444,008 A | 8/1995 | Han et al. | |
| 5,463,348 A * | 10/1995 | Sarpeshkar et al. | H03F 3/45076 330/253 |
| 5,552,332 A | 9/1996 | Tseng et al. | |
| 5,559,368 A | 9/1996 | Hu et al. | |
| 5,608,253 A | 3/1997 | Liu et al. | |
| 5,622,880 A | 4/1997 | Burr et al. | |
| 5,624,863 A | 4/1997 | Helm et al. | |
| 5,625,568 A | 4/1997 | Edwards et al. | |
| 5,641,980 A | 6/1997 | Yamaguchi et al. | |
| 5,663,583 A | 9/1997 | Matloubian et al. | |
| 5,712,501 A | 1/1998 | Davies et al. | |
| 5,719,422 A | 2/1998 | Burr et al. | |
| 5,726,488 A | 3/1998 | Watanabe et al. | |
| 5,726,562 A | 3/1998 | Mizuno | |
| 5,731,626 A | 3/1998 | Eaglesham et al. | |
| 5,736,419 A | 4/1998 | Naem | |
| 5,753,555 A | 5/1998 | Hada | |
| 5,754,826 A | 5/1998 | Gamal et al. | |
| 5,756,365 A | 5/1998 | Kakumu | |
| 5,763,921 A | 6/1998 | Okumura et al. | |
| 5,780,899 A | 7/1998 | Hu et al. | |
| 5,847,419 A | 12/1998 | Imai et al. | |
| 5,861,334 A | 1/1999 | Rho | |
| 5,865,003 A | 2/1999 | Klett et al. | |
| 5,877,049 A | 3/1999 | Liu et al. | |
| 5,885,876 A | 3/1999 | Dennen | |
| 5,889,315 A | 3/1999 | Farrenkopf et al. | |
| 5,895,954 A | 4/1999 | Yasumura et al. | |
| 5,899,714 A | 5/1999 | Farrenkopf et al. | |
| 5,918,129 A | 6/1999 | Fulford, Jr. et al. | |
| 5,923,067 A | 7/1999 | Voldman | |
| 5,923,987 A | 7/1999 | Burr | |
| 5,936,868 A | 8/1999 | Hall | |
| 5,946,214 A | 8/1999 | Heavlin | |
| 5,985,705 A | 11/1999 | Seliskar | |
| 5,989,963 A | 11/1999 | Luning et al. | |
| 6,001,695 A | 12/1999 | Wu | |
| 6,020,227 A | 2/2000 | Bulucea | |
| 6,043,139 A | 3/2000 | Eaglesham et al. | |
| 6,060,345 A | 5/2000 | Hause et al. | |
| 6,060,364 A | 5/2000 | Maszara et al. | |
| 6,066,533 A | 5/2000 | Yu | |
| 6,072,217 A | 6/2000 | Burr | |
| 6,087,210 A | 7/2000 | Sohn | |
| 6,087,691 A | 7/2000 | Hamamoto | |
| 6,088,518 A | 7/2000 | Hsu | |
| 6,091,286 A | 7/2000 | Blauschild | |
| 6,096,611 A | 8/2000 | Wu | |
| 6,103,562 A | 8/2000 | Son et al. | |
| 6,121,153 A | 9/2000 | Kikkawa | |
| 6,147,383 A | 11/2000 | Kuroda | |
| 6,153,920 A | 11/2000 | Gossmann et al. | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,198,157 B1 | 3/2001 | Ishida et al. | |
| 6,218,892 B1 | 4/2001 | Soumyanath et al. | |
| 6,218,895 B1 | 4/2001 | De et al. | |
| 6,221,724 B1 | 4/2001 | Yu et al. | |
| 6,229,188 B1 | 5/2001 | Aoki et al. | |
| 6,232,164 B1 | 5/2001 | Tsai et al. | |
| 6,235,597 B1 | 5/2001 | Miles | |
| 6,245,618 B1 | 6/2001 | An et al. | |
| 6,268,640 B1 | 7/2001 | Park et al. | |
| 6,271,070 B2 | 8/2001 | Kotani et al. | |
| 6,271,551 B1 | 8/2001 | Schmitz et al. | |
| 6,288,429 B1 | 9/2001 | Iwata et al. | |
| 6,297,132 B1 | 10/2001 | Zhang et al. | |
| 6,300,177 B1 | 10/2001 | Sundaresan et al. | |
| 6,313,489 B1 | 11/2001 | Letavic et al. | |
| 6,319,799 B1 | 11/2001 | Ouyang et al. | |
| 6,320,222 B1 | 11/2001 | Forbes et al. | |
| 6,323,525 B1 | 11/2001 | Noguchi et al. | |
| 6,326,666 B1 | 12/2001 | Bernstein et al. | |
| 6,335,233 B1 | 1/2002 | Cho et al. | |
| 6,358,806 B1 | 3/2002 | Puchner | |
| 6,380,019 B1 | 4/2002 | Yu et al. | |
| 6,391,752 B1 | 5/2002 | Colinge et al. | |
| 6,426,260 B1 | 7/2002 | Hshieh | |
| 6,426,279 B1 | 7/2002 | Huster et al. | |
| 6,432,754 B1 | 8/2002 | Assaderaghi et al. | |
| 6,444,550 B1 | 9/2002 | Hao et al. | |
| 6,444,551 B1 | 9/2002 | Ku et al. | |
| 6,449,749 B1 | 9/2002 | Stine | |
| 6,461,920 B1 | 10/2002 | Shirahata et al. | |
| 6,461,928 B2 | 10/2002 | Rodder | |
| 6,472,278 B1 | 10/2002 | Marshall et al. | |
| 6,482,714 B1 | 11/2002 | Hieda et al. | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,503,805 B2 | 1/2003 | Wang et al. | |
| 6,506,640 B1 | 1/2003 | Ishida et al. | |
| 6,509,795 B1 * | 1/2003 | Ivanov | H03F 3/45735 330/253 |
| 6,518,623 B1 | 2/2003 | Oda et al. | |
| 6,521,470 B1 | 2/2003 | Lin et al. | |
| 6,534,373 B1 | 3/2003 | Yu | |
| 6,541,328 B2 | 4/2003 | Whang et al. | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,552,377 B1 | 4/2003 | Yu | |
| 6,573,129 B2 | 6/2003 | Hoke et al. | |
| 6,576,535 B2 | 6/2003 | Drobny et al. | |
| 6,600,200 B1 | 7/2003 | Lustig et al. | |
| 6,614,280 B1 * | 9/2003 | Panwitz | H03F 1/3217 327/307 |
| 6,620,671 B1 | 9/2003 | Wang et al. | |
| 6,624,488 B1 | 9/2003 | Kim | |
| 6,627,473 B1 | 9/2003 | Oikawa et al. | |
| 6,630,710 B1 | 10/2003 | Augusto | |
| 6,660,605 B1 | 12/2003 | Liu | |
| 6,662,350 B2 | 12/2003 | Fried et al. | |
| 6,667,200 B2 | 12/2003 | Sohn et al. | |
| 6,670,260 B1 | 12/2003 | Yu et al. | |
| 6,693,333 B1 | 2/2004 | Yu | |
| 6,730,568 B2 | 5/2004 | Sohn | |
| 6,737,724 B2 | 5/2004 | Hieda et al. | |
| 6,743,291 B2 | 6/2004 | Ang et al. | |
| 6,743,684 B2 | 6/2004 | Liu | |
| 6,751,519 B1 | 6/2004 | Satya et al. | |
| 6,753,230 B2 | 6/2004 | Sohn et al. | |
| 6,760,900 B2 | 7/2004 | Rategh et al. | |
| 6,770,944 B2 | 8/2004 | Nishinohara et al. | |
| 6,787,424 B1 | 9/2004 | Yu | |
| 6,797,553 B2 | 9/2004 | Adkisson et al. | |
| 6,797,602 B1 | 9/2004 | Kluth et al. | |
| 6,797,994 B1 | 9/2004 | Hoke et al. | |
| 6,808,004 B2 | 10/2004 | Kamm et al. | |
| 6,808,994 B1 | 10/2004 | Wang | |
| 6,813,750 B2 | 11/2004 | Usami et al. | |
| 6,821,825 B2 | 11/2004 | Todd et al. | |
| 6,821,852 B2 | 11/2004 | Rhodes | |

(56) References Cited

U.S. PATENT DOCUMENTS

| | | |
|---|---|---|
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,247,896 B2 | 7/2007 | Oh et al. |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,510,932 B2 | 3/2009 | Oh et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |

(56) References Cited

U.S. PATENT DOCUMENTS

| | | | |
|---|---|---|---|
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 8,400,219 B2 * | 3/2013 | Clark et al. ......... H03F 3/45183 330/257 |
| 2001/0014495 A1 | 8/2001 | Yu |
| 2002/0033511 A1 | 3/2002 | Babcock et al. |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0053457 A1 | 3/2004 | Sohn |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0056877 A1 | 3/2005 | Rueckes et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0017100 A1 | 1/2006 | Bol et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li et al. |
| 2006/0154428 A1 | 7/2006 | Dokumaci |
| 2006/0157794 A1 | 7/2006 | Doyle et al. |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0004107 A1 | 1/2007 | Lee et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0001171 A1 | 1/2008 | Tezuka et al. |
| 2008/0067589 A1 | 3/2008 | Ito et al. |
| 2008/0108208 A1 | 5/2008 | Arevalo et al. |
| 2008/0138953 A1 | 6/2008 | Challa et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. |
| 2009/0057746 A1 | 3/2009 | Sugll et al. |
| 2009/0057762 A1 | 3/2009 | Bangsaruntip et al. |
| 2009/0108350 A1 | 4/2009 | Cai et al. |
| 2009/0121298 A1 | 5/2009 | Furukawa et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |

(56) References Cited

U.S. PATENT DOCUMENTS

| | | | |
|---|---|---|---|
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0055886 A1 | 3/2010 | Izumida et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | | |
|---|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| KR | 10-2005-0099328 B1 | 10/2005 |
| WO | 2011062788 A1 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Laveant, P. "Incorporation, Diffusion and Agglomeration of Carbon in Silicon", 2002, Solid State Phenomena, vols. 82-84, pp. 189-194.

Noda, K et al., "A 0.1-µm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18-µm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999,Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, S et al., "MOS Scaling: Transistor Challenges for the 21st Century", 1998, Intel Technology Journal Q3' 1998, pp. 1-19.

Wann, C. et al., "Channel Profile Optimization and Device Design for Low-Power High-Performance Dynamic-Threshold MOSFET", 1996, IEDM 96, pp. 113-116.

Werner, P. et al., "Carbon Diffusion in Silicon", Oct. 1998, Applied Physics Letters, vol. 73, No. 17, pp. 2465-2467.

Yan, Ran-Hong et al., "Scaling the Si MOSFET: From Bulk to SOI to Bulk", Jul. 1992, IEEE Transactions on Electron Devices, vol. 39, No. 7.

Dreslinkski, Ronald G. et al., "Near-Threshold Computing: Reclaiming Moore's Law Through Energy Efficient Integrated Circuits", Feb. 2010, Proceedings of the IEEE, vol. 98, Issue 2, IEEE.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, (2004).

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.

Wong, H et al., "Nanoscale CMOS", Proceedings of the IEEE, Vo. 87, No. 4, pp. 537-570.

Machine Translation of KR 10-0794094 Submitted herewith.

Banerjee et al, "Compensating Non-Optical Effects using Electrically-Driven Optical Proximity Correction", Proc. of SPIE, vol. 7275, 2009.

Cheng et al, "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

(56) References Cited

OTHER PUBLICATIONS

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shao et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

English Translation of JP 8153873 Submitted herewith.

\* cited by examiner

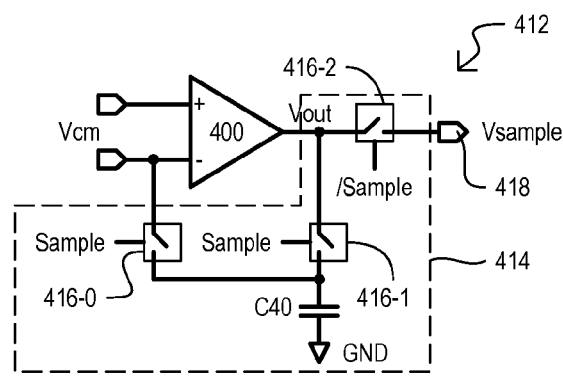
FIG. 4
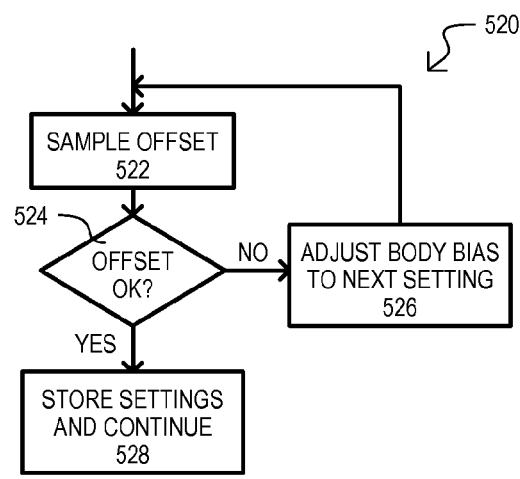
FIG. 5
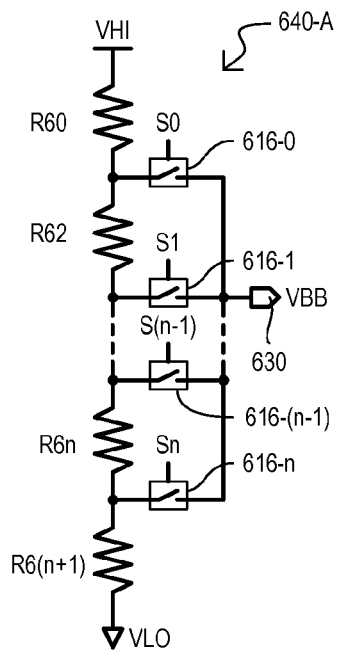
FIG. 6A
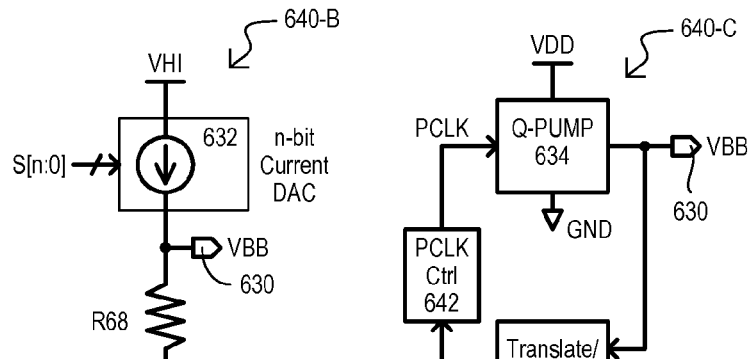
FIG. 6B
FIG. 6C (BACKGROUND)

OPERATIONAL AMPLIFIER INPUT OFFSET CORRECTION WITH TRANSISTOR THRESHOLD VOLTAGE ADJUSTMENT

TECHNICAL FIELD

The present invention relates generally to integrated circuit operational amplifiers (op amps), and more particularly to reducing the input offset voltage of op amps.

BACKGROUND

Operational amplifiers (op amps) are fundamental elements in various analog circuit designs. An example of an op amp 1200 is shown in FIG. 12. Op amp 1200 can include a positive input (+), a negative input (−), and can generate an output voltage Vout on an output 1291. Ideally, an op amp 1200 operates according to the response Vout=Gain*(IN(+)−IN(−)), where Gain is the open loop gain of the op amp, IN(+) is the voltage at the (+) input and IN(−) is the voltage at the (−) input. Accordingly, in an ideal op amp, when a common voltage is applied to both the (+) input and (−) input, an output voltage would be zero.

In reality, when a common voltage is applied to both inputs of an op amp, Vout will not be zero, due to uncontrollable variations in the op amp components and/or materials. For example, an op amp typically has a differential input stage with input transistors designed to match one another. These matching input transistors are designed to have the same size and to be fabricated with the same process steps. However, mismatch between input transistors can occur. As but a few examples, there may be mismatch due to essentially random effects, such as edge effects during photolithography, material imperfections, and variations in carrier mobility. Device mismatch can cause differences between the input transistors, including differences in transistor threshold voltage (Vt), conductance parameter K, and body effect parameter γ.

A differential voltage applied between the (+) and (−) inputs of an op amp which results in a zero output voltage (i.e., a voltage that cancels mismatching) is called the input offset voltage (Voffset) of the op amp.

Conventional approaches to addressing input offset voltage include "auto-zeroing" type op amps, adjusting biasing currents in an input stage, or digital adjustment of input device size. Auto-zeroing op amps can result in larger circuit size and operation complexity. Adjusting biasing currents can also increase circuit complexity, particularly when very fine changes in current are needed over a range of operating temperatures and/or voltages. Digitally adjusting device size may result in better size matching, but random variations in materials can still give rise to an input offset voltage.

BRIEF DESCRIPTION OF THE DRAWINGS

FIG. 4 is a block schematic diagram of a system according to an embodiment.

FIG. 5 is a flow diagram of a method according to an embodiment.

FIGS. 6A to 6C are block schematic diagrams of body bias circuits that can be included in embodiments.

DETAILED DESCRIPTION

Figure 1A:
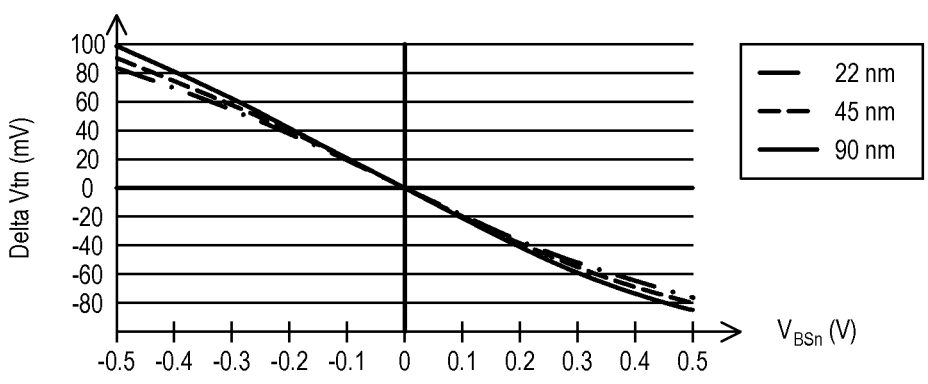
FIGS. 1A and 1B are graphs showing how threshold voltages of transistors within an operational amplifier (op amp) can be varied by changing body biasing, to thereby address transistor mismatch, thus reduce input offset voltage.

Various embodiments of the present invention will now be described with reference to a number of drawings. The embodiments show systems and methods for reducing an input offset voltage of an operational amplifier (op amp) by varying a threshold voltage of one or more transistors in an input stage. Such a change in threshold voltage can be achieved by varying a body bias voltage of the transistor(s).

In the embodiments below, like items are referred to by the same reference character but with the leading digit(s) corresponding to the figure number.

Embodiments of the invention can include op amps having insulated gate field effect transistors. Such transistors will be referred to herein as metal-oxide semiconductor (MOS) transistors, but this should not be construed as limiting the transistors to any particular gate, gate insulator, or body material. MOS transistors can operate according to a threshold voltage (Vth) having a value given by:

$$Vth = Vth_0 + \gamma(\sqrt{2\varphi_f - V_{BS}} - \sqrt{2\varphi_f})$$

where γ is the body effect parameter given by, $$\gamma = \left(\frac{t_{ox}}{e_{ox}}\right)\sqrt{2q\varepsilon_{Si}N_A}$$

and where $Vth_0$ is the threshold voltage with no substrate bias, $2\varphi_f$ is the surface potential, and $V_{BS}$ is the substrate bias, $t_{ox}$ is the gate oxide thickness, $\in_{ox}$ is the gate oxide permittivity, q is the charge of an electrode, $\in_{Si}$ is the permittivity of silicon, $e_{ox}$ is the permittivity of oxide, q is the charge of an electron, and $N_A$ is the doping concentration.

Figure 1B:
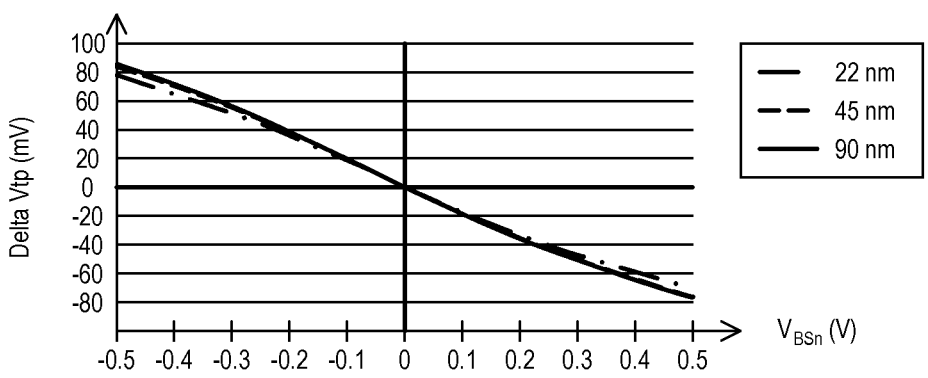

FIGS. 1A and 1B are graphs showing a change in Vth versus body bias voltage for conventional MOS transistors at a number of technology nodes (22 nm, 45 nm and 90 nm). As technology scales down (i.e., the smaller the technology node), there is a slight decrease in γ for a corresponding decrease in Vth change. FIG. 1A shows Vth variability for n-channel transistors (Vtn), while FIG. 1B shows variability for p-channel transistors (Vtp).

Embodiments of the invention can use changes in transistor threshold voltage (Vtn or Vtp) resulting from body biasing (VBSn, VBSp) to reduce the input offset voltage of an op amp. For example, in some embodiments, in the event matching transistors have different threshold voltages, the body biasing of one or more transistors can be varied to arrive at better matching threshold voltages. In other embodiments, varying the threshold voltage in a transistor can counteract other mismatching effects.

Figure 2A:
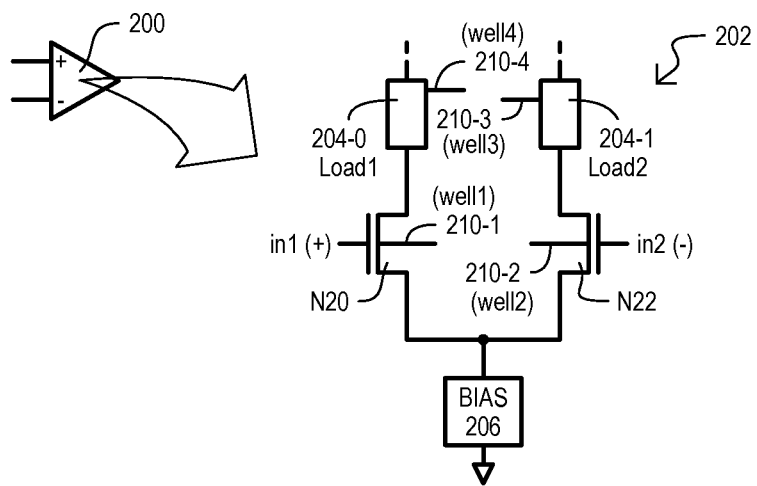
FIGS. 2A and 2B are block schematic diagrams of op amps according to embodiments.

FIG. 2A is a diagram showing an op amp 200 according to one embodiment. As shown, an op amp 200 can have an input stage 202 that includes a differential pair of n-channel MOS input transistors N20 and N22, corresponding load sections 204-0/1, and a bias circuit 206. Transistors N20 and N22 can have sources commonly connected to the bias circuit 206, which can provide a bias current for the input stage 202. Transistor N20 can have a gate connected to a (+) input of the op amp 200 and a drain connected to load section 204-0. Transistor N22 can have a gate connected to a (−) input of the op amp 200 and a drain connected to load section 204-1.

Unlike a conventional op amp, where transistors of the same differential pair can be formed in the same well to ensure matching fabrication conditions and/or body biasing, in the embodiment of FIG. 2A, transistor N20 is formed in one well (well1), while transistor N22 is formed in a separate well (well2). Consequently, transistors N20 and N22 can receive body biases that are different from one another. Embodiments can include any number of different body biasing arrangements. For example, a body bias of transistor N20 can be varied while that of transistor N22 is not varied, a body bias of transistor N22 can be varied while that of transistor N20 is not varied, or the body biases of transistors N20 and N22 can both be varied. In such various combinations, body bias voltages can be applied via well taps 210-1 and/or 210-2.

In some embodiments, load sections 204-0/1 can be active loads formed by one or more transistors. Optionally, one or more transistors in each load section 204-0/1 can be formed in separate wells. FIG. 2A shows load section 204-0 formed in one well (well 3), while load section 204-1 is formed in another well (well 4). Such wells can be biased to change the threshold voltages of transistors within the wells. This can also be used to reduce an input offset voltage of the op amp. As in the case of the differential pair N20/N22, embodiments can include varying the body bias voltages of transistors in one or both load sections 204-0/1. In such various combinations, body bias voltages can be applied via well taps 210-3 and/or 210-4.

In FIG. 2A, input transistor N20 and any transistors within load section 204-0 can be conceptualized as being operational in response to a voltage at a (+) input of op amp 200, and thus will be referred to herein as being associated with the (+) input. Likewise, while input transistor N22 and any transistors within load section 204-1 can be conceptualized as being operational in response to a voltage at a (−) input of op amp 200, and thus associated with the (−) input. As will be described in more detail below, in some embodiments, based on the polarity of an offset voltage, the body bias of transistors associated with one input can be adjusted.

It is understood that an operational amplifier according to embodiments can include input transistors (e.g., N20/N22) have separately biasable bodies, load sections (e.g., 204-0/1) have transistors with separately biasable bodies, and combinations thereof.

In this way, one or more transistors from an input stage of an op amp can have their threshold voltages changed by altering a body biasing, and thereby reduce an input offset voltage of the op amp.

Figure 2B:
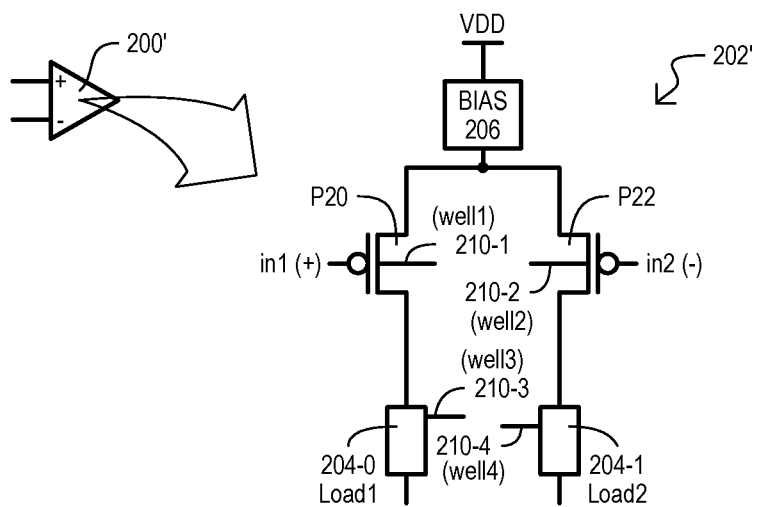

FIG. 2B shows an op amp 200' according to another embodiment. Op amp 200' can include an input stage 202' like that of FIG. 2A, but can have transistors of opposite conductivity type. Accordingly, unlike FIG. 2A the differential pair 202' can be formed by p-channel MOS transistors P20 and P22.

Op amp 200' can otherwise be subject to the same various body biasing combinations described with reference to FIG. 2A.

Figure 3A:
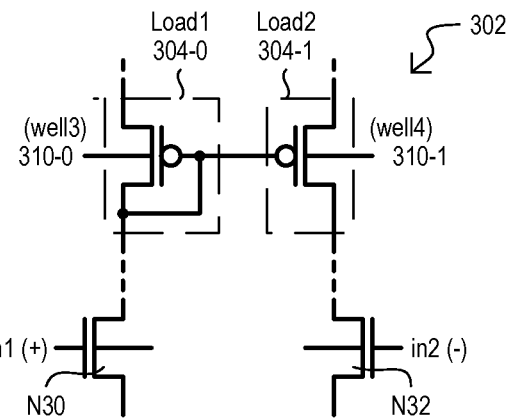
FIGS. 3A and 3B are schematic diagrams of op amp input sections according to embodiments.
Figure 3B:
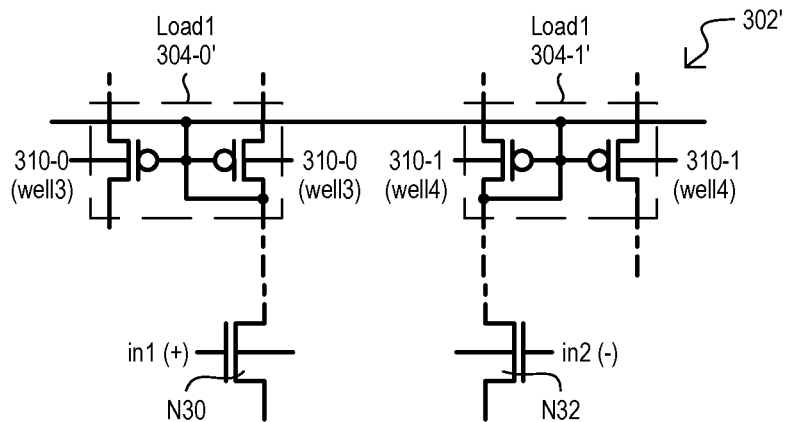

As noted above, in some embodiments, transistors within active loads of op amp input stages can have threshold voltages adjusted via body biasing to reduce an input offset voltage. FIGS. 3A and 3B show very particular examples of such input stages.

FIG. 3A is schematic diagram of an input stage 302 that can be included in an op amps according to one embodiment. Input stage 302 can include n-channel input transistor N30 and corresponding load section 304-0 both associated with the (+) input, as well as n-channel input transistor N32 and corresponding load section 304-1 associated with the (−) input. One or more p-channel transistors within each load 304-0/1 can be separately body biased via well taps 310-0 or 310-1. Either or both load sections 304-0/1 can receive an adjustable body bias. It is understood that in some embodiments, input transistors N30 and/or N32 can have body biases that are adjustable with respect to one another, but in other embodiments, such transistors can receive the same body bias (i.e., all offset correction is done by load devices). FIG. 3B is a schematic diagram of another input stage 302' that can be included in embodiments. FIG. 3B can have items like that of FIG. 3A, and subject to the same variations as FIG. 3A. FIG. 3B shows how multiple transistors within a load section can receive the same body biasing. As shown, multiple transistors within load section 304-0' can receive the same body biasing via well taps 310-0 and/or multiple transistors within load section 304-0' can receive the same body biasing via well taps 310-1. While transistors within a same load section may receive the same body biasing, such transistors are not necessarily formed in the same well.

It is understood that embodiments can include input stages having transistors with a reverse conductivity type to that of FIGS. 3A and 3B (i.e., input transistors can be p-channel transistors and/or load transistors can be n-channel transistors).

It is also understood that the particular embodiments of FIGS. 2A to 3B are intended to be exemplary and not limiting. Alternate embodiments can include varying the body biasing of any suitable transistor within the op amp that can reduce an input offset voltage.

Having described various op amp circuits in which a threshold voltage of transistor(s) can be adjusted via body biasing to reduce input offset voltage, systems for arriving at adjustment values will now be described.

FIG. 4 is a block schematic diagram of a system 412 according to one embodiment. A system 412 can include an op amp 400 and a sampling section 414.

An op amp 400 can include any of those described herein, or equivalents. That is, op amp 400 can have body bias circuits that can vary a threshold voltage of one or more transistors to reduce the input offset of the op amp.

Sampling section can include switches 416-0 to 416-2 and sampling capacitor C40. In operation, a common voltage Vcm can be applied to (+) and (−) inputs of op amp 400. Switches 416-0 and 416-1 can be closed, placing the op amp in a unity gain configuration. Accordingly, an output voltage (Vout) can be generated on sample capacitor C40, which corresponds to any input offset voltage. Subsequently, switches 416-0/1 can open and switch 416-2 can close, placing the sampled voltage on output 418. Body bias(es) of transistor(s) within op amp 400 can then be set or adjusted based on the sampled voltage.

In some embodiments, all or a portion of sampling section 414 can be formed in a same integrated circuit as the op amp 400. However, in other embodiments, all or a portion of sampling section 414 can be implemented by a testing device connected to op amp 400. Sampling of an input offset voltage of op amp 400 with system 412 can occur in a manufacturing step, to set body bias voltages for op amp 400. Alternatively, system 412 can dynamically sample an input offset voltage periodically during the operation of op amp 400.

FIG. 5 is a flow diagram of a method 520 according to an embodiment. A method 520 can include sampling an offset voltage 522. Such an action can include applying a common voltage to (+) and (−) inputs of an op amp, as described herein, or equivalents, to generate an op amp output voltage representative of the input offset voltage. A corresponding offset voltage can be determined to be acceptable (i.e., it can be compared to some threshold corresponding to a desired or target value) 524.

If an input offset voltage is determined to be too great (NO from 524), a body bias setting can be adjusted to further reduce the input offset voltage 526. Such an action can include increasing a body bias in a reverse body bias direction or a forward body bias direction, based on the transistor(s) conductivity and location within the op amp. The method 520 can then return to 522 (i.e., input offset voltage sampling can be repeated).

If an input offset voltage is determined to be acceptable (YES from 524), the current body bias setting can be saved 528. Such an action can include storing body bias setting in an integrated circuit device that contains the op amp, and using such setting during normal op amp operations. In particular embodiments, such settings can be a digital value applied to body bias generating circuits.

It is understood that all or a portion of the actions of method 520 can be executed by a device external to an integrated circuit containing the op amp (e.g., via a tester). However, in other embodiments, all or a portion of such actions can be implemented by circuits present on the same integrated circuit containing the op amp.

FIGS. 6A to 6C are block schematic diagrams of body bias generators that can be included in embodiments. Such body bias generators can provide a body bias that varies according to a multi-bit bias control value S[n:0]. Bias control value S[n:0] can be generated based on body bias setting methods, such as any of those described herein, or equivalents.

FIG. 6A shows one example of a body bias generator 640-A that can be included in embodiments. Body bias generator 640-A can include series connected resistors R60 to R6(n+1) and switches 616-0 to 616-n. Resistors (R60 to R6(n+1)) can be connected in series between a high voltage VHI and a low voltage VLO. A high voltage VHI can be a high power supply voltage (i.e., VDD), or can be a boosted power supply voltage greater than a high power supply voltage. Similarly, a low voltage VLO can be ground, or can be a negative voltage with respect to ground. Each switch (616-0 to 616-n) can have one terminal connected at the connection of two resistors (R60 to R6(n+1)) with its other terminal connected to an output node 630. Each of switches (616-0 to 616-n) can be enabled by a corresponding bit Sn to S0 of a bias control value S[n:0].

FIG. 6B shows another body bias generator 640-B that can be included in embodiments. Body bias generator 640-B can include a current digital-to-analog-converter (DAC) 632 arranged in series with a resistance R68 between voltages VHI and VLO. In FIG. 6B, a body bias voltage VBB can be generated across resistance R68 at an output node 630.

Current DAC 632 can be an n-bit DAC that enables a current to flow to resistance R68 that varies according to bias control value S[n:0]. A resistance R68 can be fixed resistance or a programmable resistance. Voltages VHI and VLO can be subject to the variations noted above for FIG. 6A.

FIG. 6C shows another body bias generator 640-C that can be included in embodiments. Body bias generator 640-C can include a charge pump circuit 634, translate/compare circuit 636, a DAC 632', and a pump clock control circuit 642. A charge pump 634 can generate a body bias voltage (VBB) at output 630 that varies according to a pump clock (PCLK) frequency and/or duty cycle. In some embodiments, a body bias voltage (VBB) generated by charge pump 634 can be outside of a power supply range (i.e., can be greater than a high power supply voltage or negative with respect to ground).

Translate/compare circuit 636 can compare a body bias voltage to a target value generated by DAC 632'. If necessary, this can include translating a negative body bias voltage to some positive value. A target value generated by DAC 632' can vary according to a bias control value S[n:0]. Based on a comparison between a current VBB and a target value, Translate/compare circuit 636 can generate control values CTRL. In response to control values CTRL, pump clock control circuit 642 can vary clock signal(s) PCLK to the charge pump circuit 634 to thereby increase or decrease the body bias voltage.

It is understood that the body bias generators shown in FIGS. 6A to 6C are provided by way of example. Embodiments can employ any suitable body bias means. Further, embodiments can include body bias generator circuits that mix the approaches shown in FIGS. 6A to 6C.

Figure 7:
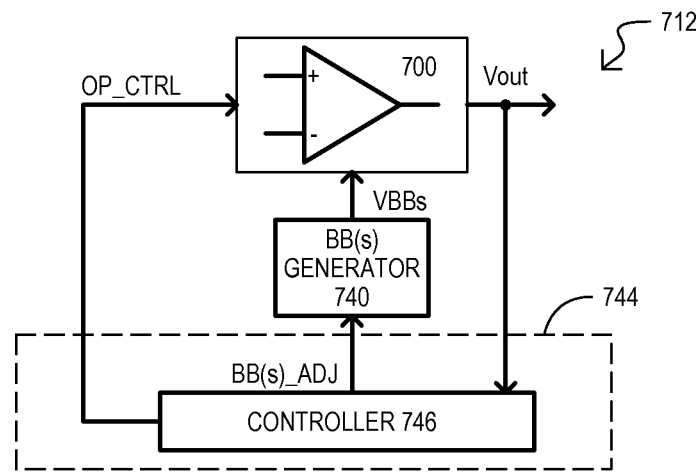
FIG. 7 is a block diagram of a system according to another embodiment.

FIG. 7 is a block schematic diagram of system 712 according to another embodiment. A system 712 can include an op amp 700, a body bias generator 740, and a controller section 744. An op amp 700 can be an op amp like any of those described herein, or equivalents. Accordingly, one or more transistors within op amp 700 can vary its threshold voltage in response to body bias voltage(s) VBBs.

A controller section 744 can include a control circuit 746. A control circuit 746 is configured to execute an input offset voltage sampling operation, and in addition, generate body bias adjustment value(s) BB(s)_ADJ based on such a sampling operation. Accordingly, control circuit 746 can generate control signals OP_CTRL which can apply a common voltage to (+) and (−) inputs of op amp 700, configure a mode of operation of the op amp (i.e., create feedback loops, etc.), and enable the generation of a corresponding output voltage Vout. Control circuit 746 can further be configured to receive output voltage Vout.

Body bias generator 740 can vary one or more body bias voltages (VBBs) in response to body bias adjustment value(s) BB(s)_ADJ from controller circuit 746. Such body bias voltage(s) VBBs can be applied to one or more transistors within op amp 700 as described herein, and equivalents.

It is noted that in some embodiments, a controller section 744 can be part of a same integrated circuit as op amp 700 and body bias generator 740. Thus, an input voltage offset reduction operation can be performed "on-board" the integrated circuit in response to predetermined conditions (e.g., on power-on or reset, periodically, or in response to changes in operating voltage or temperature, etc.). In other embodiments, a controller section 744 can be part of a device (e.g., tester) external to an integrated circuit containing op amp 700 and body bias generator 740. In such an embodiment, body bias adjustment values BB(s)_ADJ can be stored by body bias generator 740.

Figure 8:
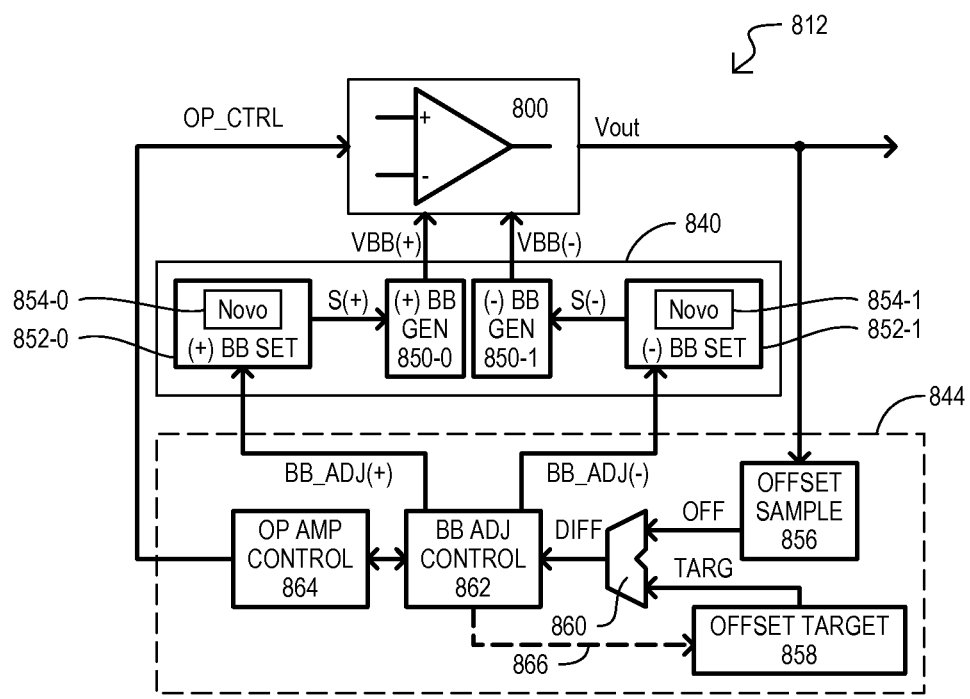
FIG. 8 is a block diagram of a system according to a further embodiment.

FIG. 8 is a block schematic diagram of a further system 812 according to an embodiment. Like FIG. 7, a system 812 can include an op amp 800, a body bias generator 840, and a controller section 844.

Op amp 800 can be an op amp like any of those described herein, or equivalents. Further, op amp 800 can include one or more transistors associated its (+) input that can receive a body bias VBB(+), as well as one or more transistors associated with its (−) input that receive a body bias VBB(−). In some embodiments, such body biases can range from reverse body bias voltage to forward body bias voltages.

Body bias generator 840 can include first body bias generator circuit 850-0, second body bias generator circuit 850-1, first body bias set circuit 852-0 and a second body bias set circuit 852-1. First body bias generator circuit 850-0 can generate one or more body bias voltages VBB(+) for transistors associated with a (+) input of op amp 800. Body bias voltages VBB(+) can vary in response to bias control values S(+) provided from first body bias set circuit 852-0. Similarly, second body bias generator circuit 850-1 can generate one or more body bias voltages VBB(−) for transistors associated with a (−) input of op amp 800 that can vary in response to bias control values S(−) provided from second body bias set circuit 852-1. Bias control values S(+)/S(−) can be changed/updated in response to bias adjustment values BB_ADJ(+)/BB_ADJ(−), respectively, that are generated by controller section 844.

Each of body bias set circuits 852-0/1 can store its bias control values S(+)/S(−) and provide such values to the corresponding body bias generator circuit 850-0/1. In the particular embodiment shown, each of body bias set circuits 852-0/1 can include corresponding nonvolatile storage 854-0/1, for storing bias control values S(+)/S(−) in a nonvolatile fashion. Accordingly, in a calibration function, body bias values for achieving a minimum input voltage offset can be determined and then programmed into such nonvolatile stores.

A controller section 844 can include an offset sampling circuit 856, an offset target circuit 858, a compare circuit 860, a body bias adjust circuit 862, and an op amp control circuit 864. An offset sampling circuit 856 can sample an output voltage (Vout) from op amp 800 corresponding to an input offset voltage of op amp 800. Offset sampling circuit 856 can output a value (OFF) to compare circuit 860 representative of a sampled input offset voltage. In some embodiments, OFF can be an analog voltage provided to compare circuit 860. However, in other embodiments, an offset sampling circuit 856 can include an analog-to-digital converter (ADC), and OFF can be a digital value.

Offset target circuit 858 can provide a target value (TARG) to compare circuit, for comparison with OFF from the offset sampling circuit 856. Value TARG can be an analog or digital value. In some embodiments, a TARG can be a dynamic value, being altered by body bias adjust circuit 862.

Compare circuit 860 can generate a difference value DIFF in response to a comparison between values TARG and OFF. Value DIFF can be provided to body bias adjust circuit 862.

Depending upon value DIFF, body bias adjust circuit 862 can generate bias adjustment values BB_ADJ(+)/BB_ADJ(−). In some embodiments, according to a DIFF value, body bias adjust circuit 862 can also update an offset target circuit 858 via feedback path 866, to change or otherwise update the current TARG value. In some embodiments, a body bias adjust circuit can include a proportional-integral-derivative (PID) controller to converge on BB_ADJ(+)/BB_ADJ(−) values that result in a minimum input offset voltage for op amp 800. Body bias adjust circuit 862 can be in communication with op amp control circuit 864, to ensure body bias voltages are set before each input voltage offset sampling operation.

Op amp control circuit 864 can generate control signals OP_CTRL which can enable an input offset voltage of op amp 800 to be sampled by offset sampling circuit 856. In very particular embodiments, control signals OP_CTRL can work as described for FIG. 7.

As in the case of FIG. 7, in some embodiments, a controller section 844 can be part of a same integrated circuit as op amp 800 and body bias generator 840. However, in other embodiments, all or a portion of controller section 844 can be part of a device (e.g., tester) external to an integrated circuit containing op amp 800 and body bias generator 840.

While embodiments have included the circuits, systems and corresponding method in the above embodiments, additional methods according to embodiments will now be described.

Figure 9:
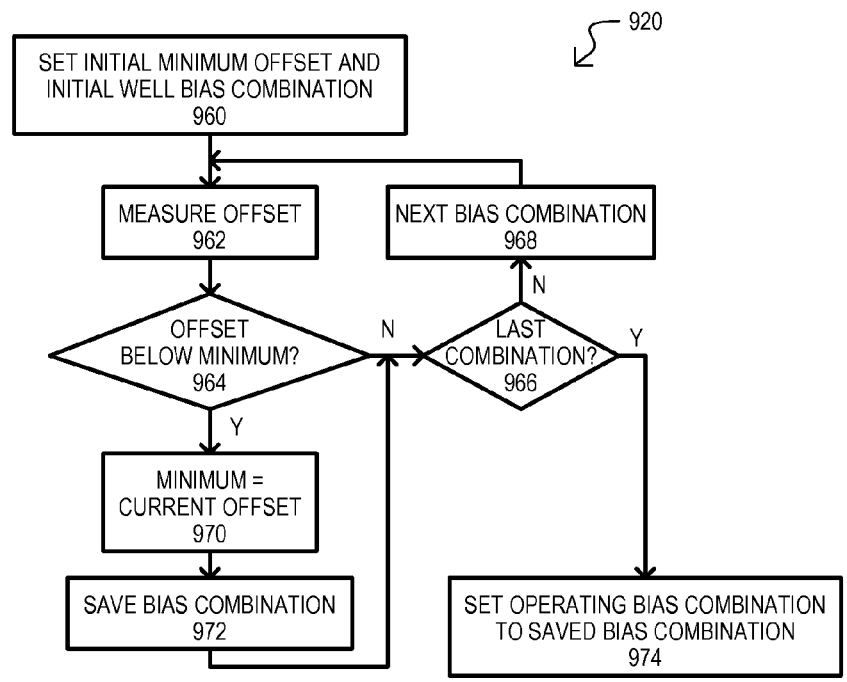
FIG. 9 is a flow diagram of a method according to another embodiment.

Referring to FIG. 9, a method 920 according to another embodiment is shown in a flow diagram. A method 920 can include setting initial minimum input offset voltage value(s), as well as an initial well bias combination 960. Such actions can include providing a bias voltage to different wells for transistors of an op amp.

An input offset voltage of the op amp can then be measured 962. Such an action can include any of the op amp input voltage sampling operations described herein, or equivalents.

A measured input offset voltage(s) can then be compared to minimum offset value(s) 962. Minimum offset values(s) can be the same, regardless of input offset voltage polarity, or can vary in response to input offset voltage polarity. Such an action can include comparing values representative of an op amp input offset voltage (e.g., digital values, or amplified values) to the minimum offset value(s).

If a measured minimum input offset voltage is less than a current minimum offset value (Y from 964), the current input offset voltage can be set as the minimum offset value 970 (i.e., the current well biasing conditions have achieved a lowest input voltage offset thus far). Such an action can include translating the current minimum offset voltage into some other form (e.g., into a digital value and/or amplify the value). The current well bias combination can then be saved 972 (as the new minimum value to be compared with). A method 920 can then proceed to 966.

If a measured minimum input offset voltage is not less than a current minimum offset value (N from 964), a determination can be made if a last bias well combination has been reached 966. In some embodiments, there can be a set collection of well bias combinations, and a method 920 can progress through each such combination. However, in other embodiments, the well bias combinations can be based on detected offset values, and alter combinations according to a predetermined process.

If a last well bias combination has not been reached (N from 966), a method 920 can select a next well bias combination 968 and then once again sample the input offset voltage (return to 962). If a last well bias combination has been reached (Y from 966), a method 920 can set the operating conditions of the op amp to the saved well bias combination 974. Such an action can result in the op amp operating with a minimum offset voltage for the various well bias combinations. As in the case of FIG. 5, all or a portion of the actions of method 920 can be executed by a device external to an integrated circuit containing the op amp or by circuits present on the same integrated circuit containing the op amp.

Figure 10:
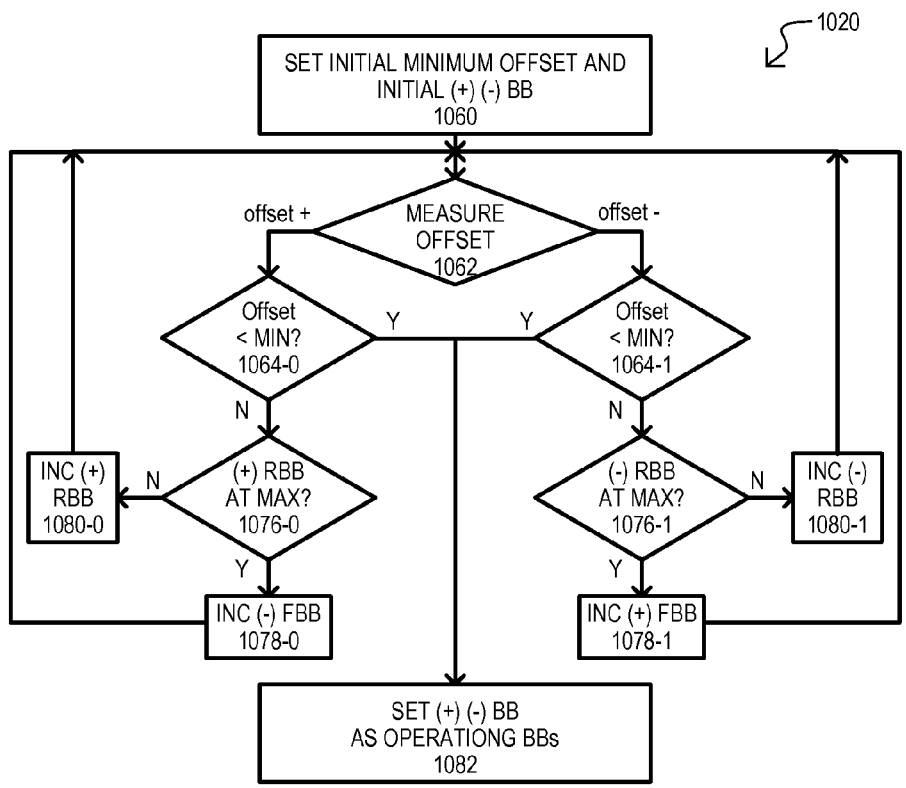
FIG. 10 is a flow diagram of a method according to a further embodiment.

Referring to FIG. 10, a method 1020 according to a further embodiment is shown in a flow diagram. A method 1020 can include setting initial minimum input offset voltage value(s), as well as initial well bias values for transistor(s) associated with a (+) input of an op amp as well as transistors associated with a (−) input of the op amp 1060.

A method 1020 can then measure an input offset voltage of the op amp 1062. If an input offset voltage is positive ("offset+" from 1062), a method 1020 can determine if an input offset voltage target has been reached 1064-0. If a minimum input offset voltage has been reached (Y from 1064-0), a method 1020 can store the current body bias voltages and the operating body bias voltages for the op amp 1082.

If an input offset voltage target has not been reached (N from 1064-0), a method 1020 can determine if a maximum reverse body bias has been reached for the transistor(s) associated with the (+) input of the op amp. If such a maximum reverse body bias has not been reached (N from 1076-0), a method 1020 can increment the current body bias voltage for the transistors associated with the (+) input in the reverse body bias direction 1080-0. A method 1020 can then return to measure the input offset voltage (1062). If a maximum reverse body bias has been reached (Y from 1076-0), a method 1020 can increment the current body bias voltage for the transistors associated with the (−) input in the forward body bias direction 1078-0. A method 1020 can then return to measure the input offset voltage (1062).

If an input offset voltage is negative ("offset −" from 1062), a method 1020 can determine if an input offset voltage target has been reached 1064-1. In some embodiments, a target for a positive input offset voltage can have the same magnitude as the target for a negative input offset voltage. However, in other embodiments, a target can vary according to the polarity of the input offset voltage. If a target input offset voltage has been reached (Y from 1064-1), a method 1020 proceed to 1082.

If a target input offset voltage has not been reached (N from 1064-1), a method 1020 can determine if a maximum reverse body bias has been reached for the transistor(s) associated with the (−) input of the op amp. If such a maximum reverse body bias has not been reached (N from 1076-1), a method 1020 can increment the current body bias voltage for the transistors associated with the (−) input in the reverse body bias direction 1080-1. A method 1020 can then return to 1062. If a maximum reverse body bias has been reached (Y from 1076-1), a method 1020 can increment the current body bias voltage for the transistors associated with the (+) input in the forward body bias direction 1078-1. A method 1020 can then return to 1062. As in the case of FIGS. 5 and 9, all or a portion of the actions of method 1020 can be executed by a device external to an integrated circuit containing the op amp or by circuits present on the same integrated circuit containing the op amp.

While embodiments can include op amps having conventional transistors with body biases that can vary their threshold voltage, and thereby reduce input offset voltage, in very particular embodiments, such op amp transistors can be "deeply depleted channel" (DDC) transistors. DDC transistors can have an enhanced body effect as compared to conventional transistors, thus greater variations in threshold voltage can be achieved for a given body bias range and/or lower body bias voltages can be used to achieve desired changes in threshold voltage.

Figure 11A:
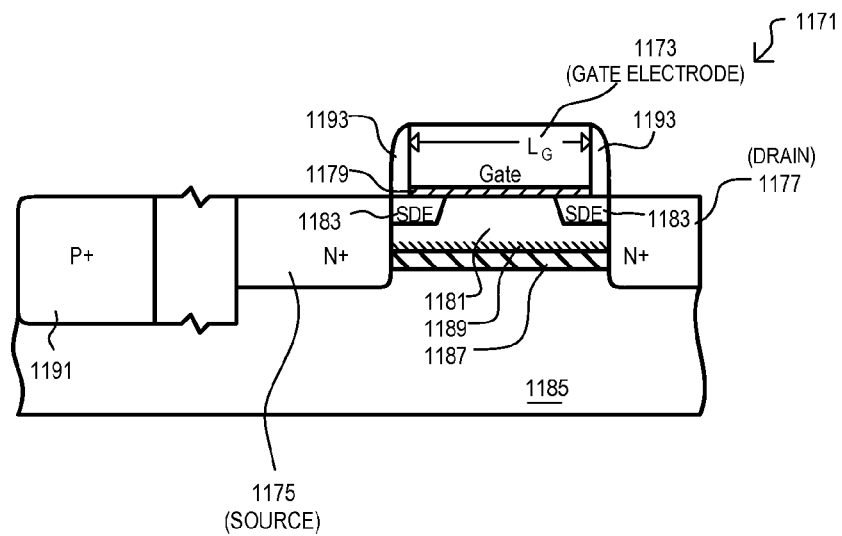
FIGS. 11A to 11C are diagrams of deeply depleted channel transistor examples that can be included in particular embodiments.

FIG. 11A shows a DDC type transistor 1171 that can be included in embodiments herein. A DDC transistor 1171 can be configured to have an enhanced body coefficient, along with the ability to set a threshold voltage (Vt) with enhanced precision. A DDC transistor 1171 can include a gate electrode 1173, source 1175, drain 1177, and a gate dielectric 1179 positioned over a substantially undoped channel 1181. Optional lightly doped source and drain extensions (SDE) 1183 can be positioned respectively adjacent to source 1175 and drain 1177. Such extensions 1183 can extend toward each other, reducing effective length of the substantially undoped channel 1181. In the embodiment shown, insulating sidewalls 1193 can be formed on sides of gate electrode 1173.

In FIG. 11A, DDC transistor 1171 is shown as an n-channel transistor having a source 1175 and drain 1177 made of n-type dopant material, formed upon a substrate such as a p-type doped silicon substrate, in which there can be a pre-defined p-well 1185. A body bias voltage VBN can be applied via a tap 1191 to the p-well 1185. However, a p-channel DDC transistors would be understood from FIG. 11A (i.e., would have reverse doping types).

In some embodiments, a DDC transistor 1171, a highly doped screening region 1187 and optional threshold voltage set region 1189 can be made with dopants of the same conductivity type as the body (i.e., p-type dopant material in FIG. 11A). In certain embodiments, a screening region 1187 can have a dopant concentration between about $1 \times 10^{18}$ to $1 \times 10^{20}$ dopant atoms/cm$^3$, with the selected dopant concentration dependent on the desired threshold voltage as well as other desired transistor characteristics. In some embodiments, a substantially undoped channel region 1181 can have a depth that ranges from approximately 5-25 nm, with the selected thickness based upon the desired threshold voltage for the transistor.

Further descriptions of a DDC transistor as well as an exemplary fabrication process and other aspects of a DDC transistor can be found in U.S. Pat. No. 8,273,617, titled "Electronic Devices and Systems, and Methods for Making and Using the Same."

Figure 11B:
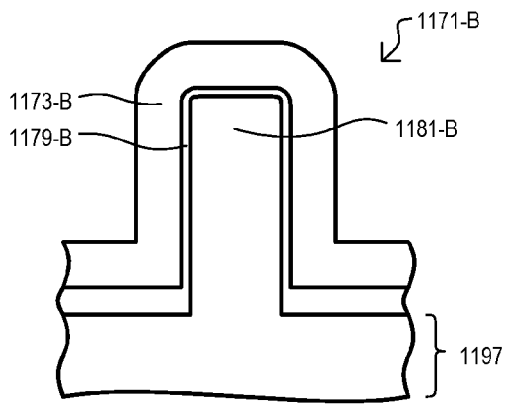

FIG. 11B shows a FinFET type transistor 1171-B that can receive a body bias voltage according to embodiments. FinFET transistor 1171-B can include a gate electrode 1173-B and gate dielectric 1179-B that surrounds a substantially undoped channel 1181-B on opposing sides. The view of FIG. 11B is taken along a channel length. Thus, it is understood that source and drain regions can extend into and out of the view shown. A body bias VBB can be applied via a connection to a substrate 1197.

Figure 11C:
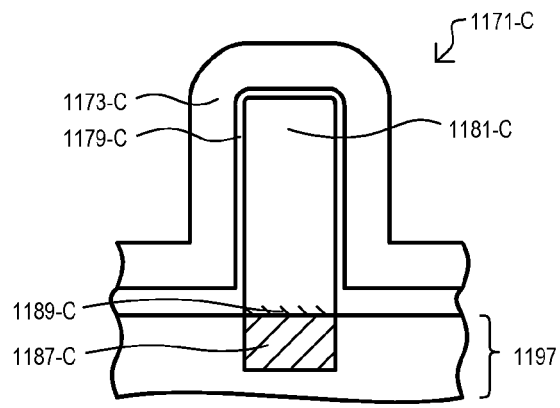
Figure 12:
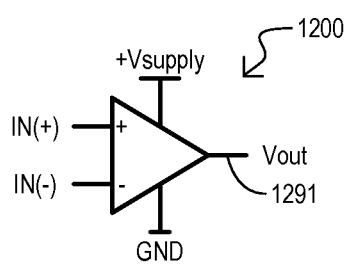
FIG. 12 shows a conventional op amp.

FIG. 11C shows a FinFET type transistor 1171-C having a screening region 1187-C, that can receive a body bias voltage according to embodiments. As in the case of FIG. 11A, the FinFET transistor 1171-C has a highly doped region that can be configured to have an enhanced body coefficient, along with the ability to set a Vt with enhanced precision. The transistor 1171-C includes a gate electrode 1173-C and gate dielectric 1179-C formed over a substantially undoped channel 1181-C on opposing sides. However, unlike FIG. 11B, a highly doped screening region 1187-C can be formed in a substrate 1197 below substantially undoped channel 1181-C rising upward three-dimensionally. Optionally, a Vt set region 1189-C can be formed between the screening region 1187-C and substantially undoped channel 1181-C.

As in the case of FIG. 11B, the view of FIG. 11C is taken along a channel length, and source and drain regions can extend into and out of the view, separated from screening region 1187-C by portions of substantially undoped channel region 1181-C. A body bias VBB can be applied via a connection to a substrate 1197. Further descriptions of a FinFET transistor having a highly doped region can be found in patent application International Application No. PCT/US12/49531 titled "Semiconductor Devices Having Fin Structures and Fabrication Methods Thereof".

It should be appreciated that in the foregoing descriptions of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the invention.

It is also understood that the embodiments may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A device, comprising:
an operational amplifier (op amp) circuit having a differential transistor pair, a first transistor of the differential transistor pair being formed in a first well of a substrate and a second transistor of the differential transistor pair being formed in a second well of the substrate;
a body bias generator configured to generate at least a first body bias voltage for the first well, and not the second well, that varies in response to a first body bias control value; and
a control circuit configured to selectively generate the first body bias control value in response to an input offset voltage of the op amp.

2. The device of claim 1, wherein:
the first transistor has a gate coupled to a positive (+) input of the op amp and the second transistor has a gate coupled to a negative (−) input of the op amp.

3. The device of claim 1, wherein:
the body bias generator includes
a first body bias generator configured to generate the first body bias voltage for the first well, and
a second body bias generator configured to generate a second body bias voltage for the second well that varies in response to a second body bias control value; and
the control circuit is configured to selectively generate the second body bias control value in response to the input offset voltage of the op amp.

4. The device of claim 1, wherein:
the control circuit comprises
an op amp control circuit configured to apply a common voltage to positive (+) and negative (−) inputs of the op amp, and
a sampling circuit configured to measure an output voltage of the op amp as the common voltage is applied to the (+) and (−) inputs of the op amp.

5. The device of claim 1, wherein:
the differential transistor pair has a conductivity type selected from the group of: n-channel transistors and p-channel transistors.

6. The device of claim 1, wherein:
the differential transistor pair comprise deeply depleted channel (DDC) transistors, each DDC transistor having a screening region formed below a substantially undoped channel, the screening region including a dopant concentration of no less than $1 \times 10^{18}$ dopant atoms/cm$^3$ with dopants of a conductivity type opposite to that of a source and drain of the DDC transistor.

7. A device, comprising:
an operational amplifier (op amp) circuit having a transistor pair of the same conductivity type, a first transistor of the pair being formed in a first well and operational in a sensing of a voltage at a positive (+) input of the op amp, and a second transistor of the pair being formed in second well and operational in a sensing of a voltage applied at a negative (−) input of the op amp;
a body bias generator configured to vary a first body bias voltage applied to the first well, and not the second well, that varies in response to a first body bias control value; and
a control circuit configured to selectively generate the first body bias control value in response to an input offset voltage of the op amp.

8. The device of claim 7, wherein:
the first transistor is a first transistor of a differential pair, having a gate coupled to the (+) input, and
the second transistor is a second transistor of the differential pair, having a gate coupled to the (−) input.

9. The device of claim 7, wherein:
the op amp further includes
a differential transistor pair comprising a first input transistor having a gate coupled to the (+) input and a second input transistor having a gate coupled the (−) input, and
the first and second transistors form part of an active load for the differential transistor pair, the first transistor being coupled to the first input transistor and the second transistor being coupled to the second input transistor.

10. The device of claim 7, wherein:
the control circuit comprises an offset sampling circuit configured to sample the input offset voltage of the op amp.

11. The device of claim 7, wherein:
the control circuit comprises a compare circuit configured to compare an offset value corresponding to the input offset voltage of the op amp with a target voltage.

12. The device of claim 7, wherein:
the body bias generator includes
a first body bias generator configured to generate the first body bias voltage for the first well, and
a second body bias generator configured to generate a second body bias voltage for the second well that varies in response to a second body bias control value; and
the control circuit is configured to selectively generate the second body bias control value in response to the input offset voltage of the op amp.

13. The device of claim 7, wherein:
the transistor pair comprise deeply depleted channel (DDC) transistors, each DDC transistor having a screening region formed below a substantially undoped channel, the screening region including a dopant concentration of no less than $1 \times 10^{18}$ dopant atoms/cm$^3$ with dopants of a conductivity type opposite to that of a source and drain of the DDC transistor.

14. A method, comprising:
determining an offset voltage of an operational amplifier (op amp) having a positive (+) input and a negative (−) input;

if the offset voltage is greater than a limit, making a change to at least a body bias voltage of a first transistor but not making the same change to a body bias voltage of a second transistor;

determining the offset voltage of the op amp after the change to the body bias voltage;

if the offset voltage is within the limit, using the body bias voltage as an operating body bias voltage for the op amp, and if the offset voltage remains greater than the limit, making another change to the body bias voltage of the first or second transistor; wherein the first transistor is coupled to one input of the op amp and the second transistor is coupled to the other input of the op amp.

15. The method of claim 14, wherein:

the first transistor is a first input transistor of a differential pair having a gate coupled to one of the op amp inputs, and the second transistor is a second input transistor of the differential pair having a gate coupled to the other of the op amp inputs.

16. The method of claim 14, wherein:

the first transistor is a load transistor coupled to a first transistor of a differential pair having a gate coupled to one of the op amp inputs.

17. The method of claim 14, wherein:

making a change to at least the body bias voltage of a first transistor includes applying a combination of body biases to a plurality of transistors; and making another change to the body bias voltage of the first or second transistor includes applying another, different combination of body biases to the plurality of transistors.

18. The method of claim 14, further including:

determining a polarity of the offset voltage of the op amp;

if the offset voltage is greater than a first limit and positive, increasing a reverse body bias to the first or second transistor coupled to the (+) input of the op amp; and if the offset voltage magnitude is greater than a second limit and negative, increasing a reverse body bias to the first or second transistor coupled to the (−) input of the op amp.

19. The method of claim 18, further including:

if the offset voltage is greater than the first limit and positive, and a maximum reverse body bias has been reached for the first or second transistor coupled to the (+) input, increasing a forward body bias to the first or second transistor coupled to the (−) input; and if the offset voltage magnitude is greater than the second limit and negative, and a maximum reverse body bias has been reached for the first or second transistor coupled to the (−) input, increasing a forward body bias to the first or second transistor coupled to the (+) input.

20. The method of claim 14, wherein:

at least the first transistor comprises a deeply depleted channel (DDC) transistor having a screening region formed below a substantially undoped channel, the screening region including a dopant concentration of no less than $1 \times 10^{18}$ dopant atoms/cm$^3$ with dopants of a conductivity type opposite to that of a source and drain of the DDC transistor.

* * * * *